United States Patent
Kadoguchi et al.

(10) Patent No.: US 9,466,549 B2
(45) Date of Patent: Oct. 11, 2016

(54) SEMICONDUCTOR MODULE

(71) Applicant: TOYOTA JIDOSHA KABUSHIKI KAISHA, Toyota-shi, Aichi-ken (JP)

(72) Inventors: Takuya Kadoguchi, Toyota (JP); Kiyofumi Nakajima, Odawara (JP); Yuuto Tanaka, Toyota (JP); Yuuki Ide, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/994,556

(22) Filed: Jan. 13, 2016

(65) Prior Publication Data
US 2016/0247743 A1 Aug. 25, 2016

(30) Foreign Application Priority Data

Feb. 24, 2015 (JP) ................... 2015-034141

(51) Int. Cl.
| | |
|---|---|
| *H01L 23/28* | (2006.01) |
| *H01L 23/367* | (2006.01) |
| *H01L 23/29* | (2006.01) |
| *H01L 21/56* | (2006.01) |
| *H01L 23/31* | (2006.01) |

(52) U.S. Cl.
CPC ......... *H01L 23/3675* (2013.01); *H01L 21/565* (2013.01); *H01L 23/293* (2013.01); *H01L 23/3107* (2013.01)

(58) Field of Classification Search
CPC ............ H01L 23/3675; H01L 23/293; H01L 21/565; H01L 23/3107; H01L 25/105
See application file for complete search history.

(56) References Cited

U.S. PATENT DOCUMENTS

2001/0048064 A1* 12/2001 Kitani ............... H01L 27/14618
                                                                250/208.1
2002/0158333 A1   10/2002 Teshima
2007/0018197 A1*  1/2007 Mochida ............... H01L 25/105
                                                                257/177

FOREIGN PATENT DOCUMENTS

| JP | 2007-95875 | * | 4/2007 |
|---|---|---|---|
| JP | 4479121 B2 | | 6/2010 |
| JP | 2011-216564 A | | 10/2011 |
| JP | 2012-244035 A | | 12/2012 |
| JP | 2013149643 A | * | 8/2013 |
| JP | 5472498 B2 | | 4/2014 |

* cited by examiner

*Primary Examiner* — A. Sefer
(74) *Attorney, Agent, or Firm* — Oliff PLC

(57) ABSTRACT

A semiconductor module has a structure in which a semiconductor device, an insulating sheet, and a cooler are stacked on each other. The semiconductor device includes a semiconductor element, a heat transfer plate that is connected to the semiconductor element, and a resin molding that seals the semiconductor element and the heat transfer plate. A side surface of the resin molding is inclined away from a center of the resin molding relative to a perpendicular direction to a contact surface of the resin molding that is in contact with the insulating sheet. An angle of inclination of the side surface relative to the perpendicular direction is 3 degrees or larger and 17 degrees or smaller.

6 Claims, 6 Drawing Sheets

SEMICONDUCTOR MODULE

TECHNICAL FIELD

This application claims priority to Japanese Patent Application No. 2015-034141 filed on Feb. 24, 2015, the entire contents of which are hereby incorporated by reference into the present application.

The present disclosure discloses a semiconductor module in which a semiconductor device, an insulating sheet, and a cooler are stacked on each other.

DESCRIPTION OF RELATED ART

Japanese Patent Application Publication No. 2011-216564 A discloses a technology in which a semiconductor device including a semiconductor element sealed with a resin molding and a cooler are stacked on each other and the semiconductor element, which generates heat, is cooled. Japanese Patent Application Publication No. 2011-216564 A will be hereinafter referred to as "Patent Literature 1". In the technology disclosed in Patent Literature 1, a heat transfer plate configured to transfer the heat generated by the semiconductor element is exposed on a surface of the semiconductor device (resin molding), and the heat transfer plate is fixed to the cooler.

SUMMARY

A heat transfer plate with good heat conductivity is often high in electrical conductivity, and a cooler with good cooling capability is often high in electrical conductivity as well. In the technology disclosed in Patent Literature 1, an insulating sheet is provided between an electrode (or, more specifically, a heat spreader electrically connected to the electrode) of the semiconductor element and the heat transfer plate in order to electrically insulate the electrode of the semiconductor element and the cooler from each other. That is, the insulating sheet is disposed inside the resin molding that seals the semiconductor element. The insulating sheet is made of resin, and cures when the semiconductor element is sealed with the resin molding.

In order to fix the semiconductor device to the cooler, Patent Literature 1 uses a jointing material to fix them to each other. Use a jointing material can be made unnecessary by disposing an insulating sheet made of resin outside the semiconductor device and fixing the semiconductor device and the cooler by making the insulating sheet cure.

However, disposing the insulating sheet outside the semiconductor device (resin molding) undesirably makes it easier for tensile stress or shearing stress to be applied from the resin molding to the insulating sheet when the resin molding thermally expands. The application of tensile stress or shearing stress to the insulating sheet may cause the insulating sheet to peel and/or crack. The present disclosure discloses a technology for preventing damage from being caused to an insulating sheet disposed outside a semiconductor device.

The resin molding includes a contact surface that is in contact with the insulating sheet and a side surface that is in continuity with the contact surface and that extends away from the insulating sheet. It was found that an angle of inclination of the side surface affects stress that acts on the insulating sheet and is closely related to whether the insulating sheet is easily damaged or hardly damaged.

FIG. 6 illustrates an example of a structure in which a resin molding 48, an insulating sheet 46, and a cooler 13 are stacked on each other. The resin molding 48 includes a contact surface 48a (on a part of which a heat transfer plate (not illustrated) is exposed) and a side surface 48b. In the present disclosure, an angle of inclination of the side surface 48b is based on (i.e., is zero relative to) a perpendicular direction 57 to the contact surface 48a. Moreover, an angle of inclination of the side surface 48b is negative in a case where the side surface 48b is inclined toward a center of the resin molding 48 relative to the perpendicular direction 57, and the angle of inclination of the side surface 48b is positive in a case where the side surface 48b is inclined toward an outside of the resin molding 48 relative to the perpendicular direction 57. As a result of study, it was found that when the side surface 48b illustrated in FIG. 6 is inclined in a positive direction within an angle range of 3 degrees or larger to 17 degrees or smaller, the insulating sheet 46 is hardly damaged and thus high-quality resin moldings 48 can be mass-produced. A technology disclosed herein was created on the basis of these findings.

A semiconductor module disclosed herein comprises a semiconductor device, an insulating sheet, and a cooler, and the semiconductor device, the insulating sheet, and the cooler are stacked on each other. The semiconductor device comprises a semiconductor element, a heat transfer plate connected to the semiconductor element, and a resin molding sealing the semiconductor element and the heat transfer plate. The resin molding includes a contact surface that is in contact with the insulating sheet and a side surface that extends away from the insulating sheet. The heat transfer plate is exposed on a part of the contact surface. In the semiconductor module disclosed herein, the side surface of the resin molding is inclined away from a center of the resin molding relative to a perpendicular direction to the contact surface. An angle of inclination of the side surface of the resin molding relative to the perpendicular direction is 3 degrees or larger and 17 degrees or smaller.

As a result of study, it was found that when the angle of inclination of the side surface of the resin molding is +17 degrees or smaller, the stress that is applied from the resin molding to the insulating sheet by the thermal expansion of the resin molding is reduced and kept equal to or lower than a proof stress of the insulating sheet. In fact, when the angle of inclination of the side surface of the resin molding is +17 degrees or smaller, it is possible to suppress damage to the insulating sheet. When the angle of inclination of the side surface of the resin molding is +3 degrees or larger, the resin molding can be easily taken out of a mold. When the side surface of the resin molding is inclined in the positive direction within the angle range of 3 degrees or larger to 17 degrees or smaller, the insulating sheet is hardly damaged and thus high-quality resin moldings (semiconductor devices) can be mass-produced.

In another aspect of the present disclosure, a semiconductor module disclosed herein may further comprise a resin member that is in contact with both of the side surface of the resin molding and the insulating sheet. In such a case, the semiconductor device includes a semiconductor element, a heat transfer plate that is connected to the semiconductor element, and a resin molding that seals the semiconductor element and the heat transfer plate. The resin molding includes a first contact surface that is in contact with the insulating sheet and a side surface that extends away from the insulating sheet. The heat transfer plate is exposed on a part of the first contact surface. In this case, the side surface of the resin molding is inclined away from a center of the resin molding relative to a perpendicular direction to the first contact surface. Further, an angle of inclination of the side surface of the resin molding relative to the perpendicular direction is 3 degrees or larger. Further, the resin member includes a second contact surface that is in contact with the insulating sheet and a non-contact surface that is in contact with neither the insulating sheet nor the resin molding. When an angle of inclination of the non-contact surface of the resin member is positive in a case where the non-contact surface of the resin member is inclined away from the center of the resin molding relative to a direction perpendicular to the second contact surface, the angle of inclination of the non-contact surface of the resin member relative to the perpendicular direction is 17 degrees or smaller. When the angle of inclination of the non-contact surface of the resin member is 17 degrees or smaller, there is a reduction in magnitude of stress that is generated in the insulating sheet. This makes it possible to suppress damage to the insulating sheet. In this case, the resin molding can be molded so that the angle of inclination of the side surface of the resin molding is larger than 17 degrees.

DETAILED DESCRIPTION OF INVENTION

First Embodiment

Figure 1:
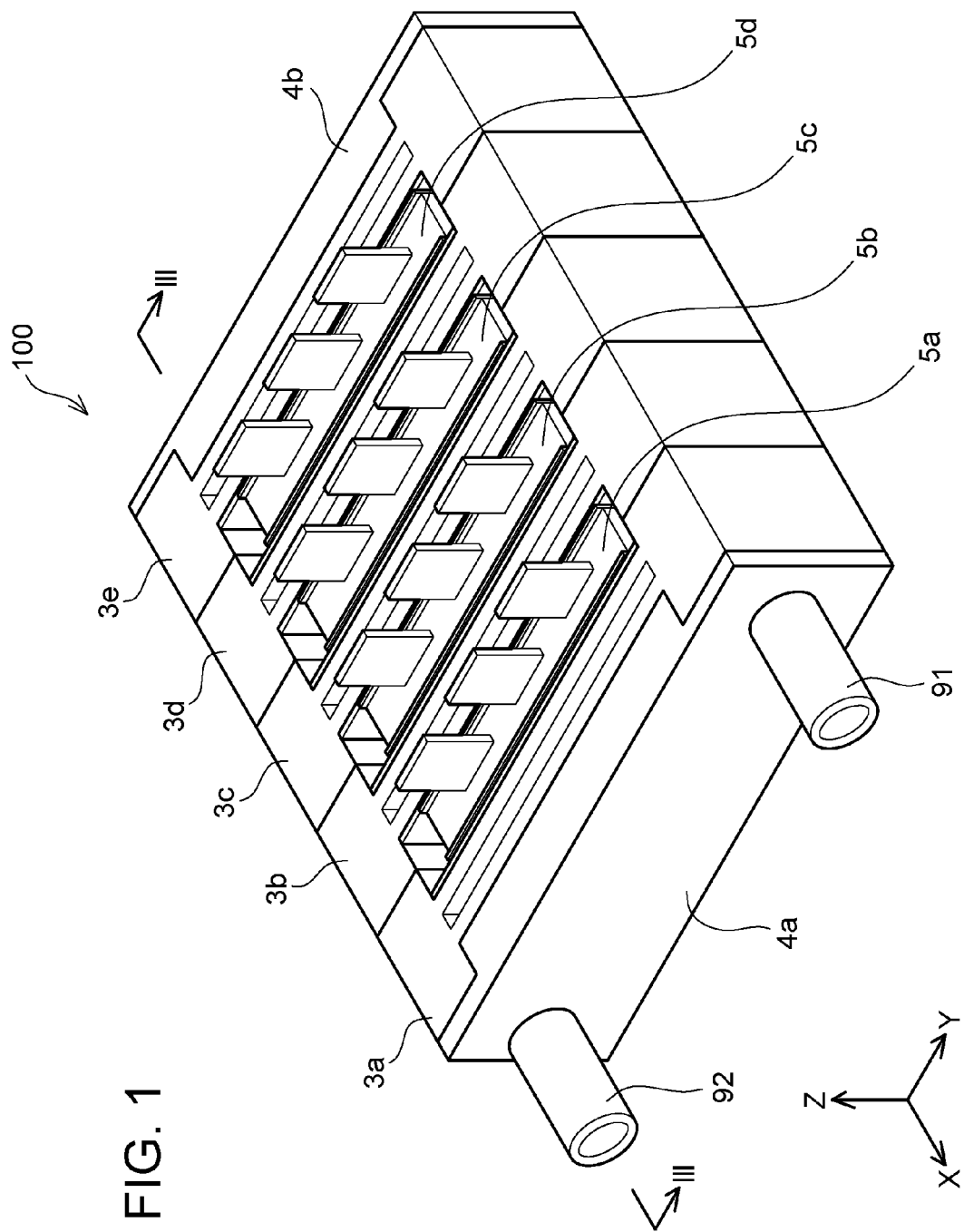
FIG. 1 is a perspective view of an apparatus in which a semiconductor module according to a first embodiment is used.

A semiconductor module 10 and a power converter 100 in which the semiconductor module 10 is used are described with reference to FIGS. 1 to 3. It should be noted that components having substantially a same structure may sometimes be hereinafter referred to with the omission of alphabetical letters added to an end of their reference numerals.

The power converter 100 shown in FIG. 1 is an apparatus configured to convert a direct current into an alternating current, and is mounted, for example, in an electric vehicle. The power converter 100 comprises a voltage converter configured to boost an output voltage of a battery and an inverter configured to convert a boosted direct current into an alternating current and supply the alternating current to a drive motor. The power converter 100 includes a plurality of semiconductor devices 5a to 5d. The semiconductor devices 5a to 5d house therein semiconductor elements configuring the aforementioned voltage converter, the aforementioned inverter, and the like. As will be described in detail later, the semiconductor devices 5a to 5d form a part of the semiconductor module 10 according to the present embodiment. It should be noted that it is possible to increase and decrease the number of semiconductor devices 5 as needed. As will be described in detail later, each semiconductor device 5 includes a semiconductor element, a heat transfer plate connected to the semiconductor element, and a resin molding sealing the semiconductor element and the heat transfer plate. Such a semiconductor device can be also called a "power card".

The power converter 100 includes four semiconductor devices 5 (semiconductor devices 5a to 5d) and five coolers 3 (coolers 3a to 3e). The semiconductor devices 5 and the coolers 3 are alternately stacked on each other along an X direction (stacking direction). A cover 4a is attached to a surface of the cooler 3a that is not in contact with a semiconductor device. Further, a cover 4b is attached to a surface of the cooler 3e that is not in contact with a semiconductor device. The coolers 3 and the semiconductor devices 5 are fixed to each other by applying compressive force to the cover 4a and the cover 4b in the X direction. As will be described in detail later, the coolers 3 are hollow, and the coolers 3a to 3e communicate with each other. A coolant supply pipe 91 and a coolant discharge pipe 92 are connected to the coolers 3. Coolant supplied from the coolant supply pipe 91 cools the semiconductor devices 5 while circulating through inside of the coolers 3, and is discharged out of the coolant discharge pipe 92. The coolant used is generally water or an LLC (long-life coolant).

Figure 2:
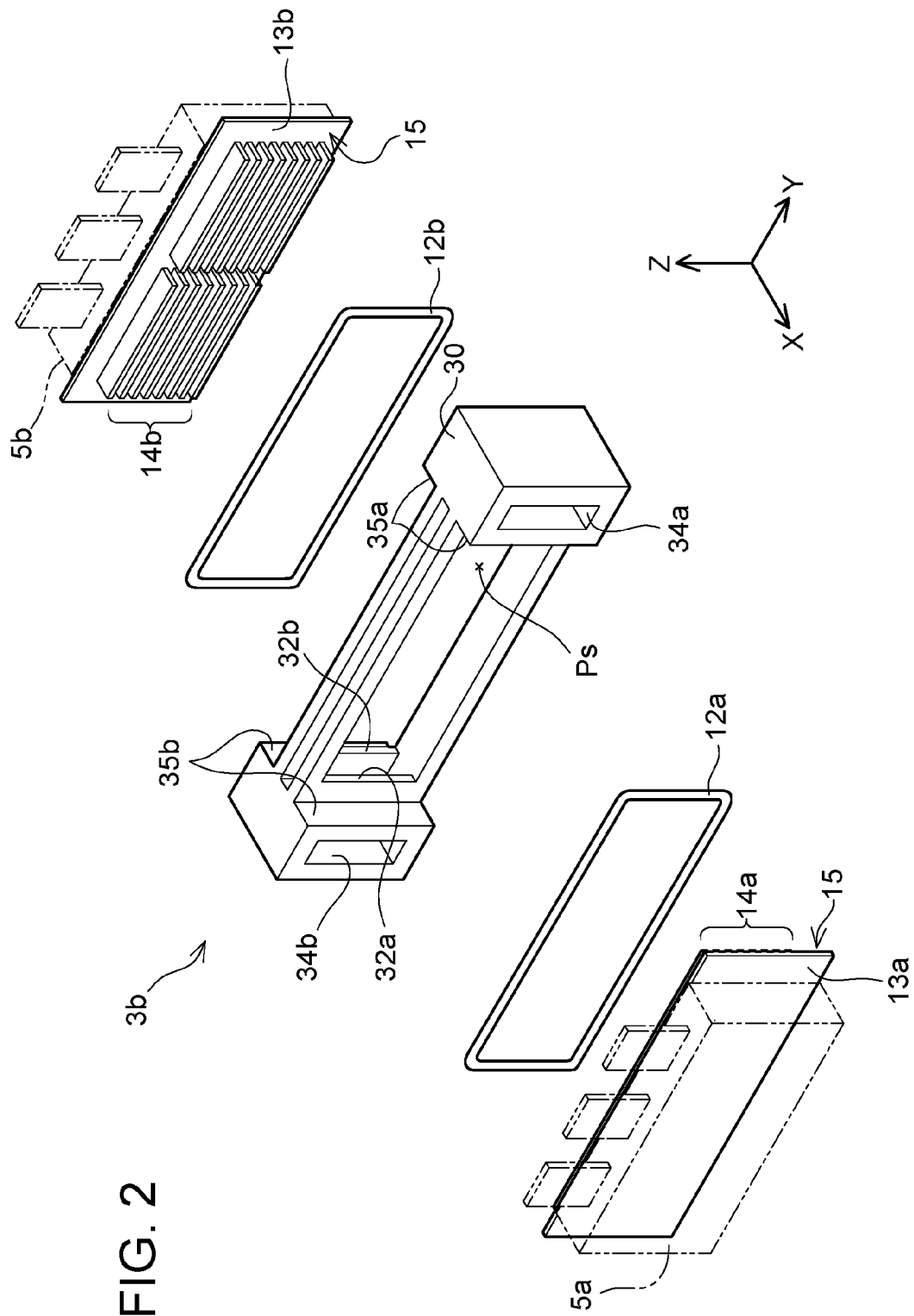
FIG. 2 is an exploded perspective view of a part of the apparatus shown in FIG. 1.

FIG. 2 is an exploded perspective view of a part of the power converter 100 shown in FIG. 1 in which the semiconductor device 5a, the cooler 3b, and the semiconductor device 5b are stacked on each other. It should be noted that the semiconductor device 5a and the semiconductor device 5b are indicated by virtual lines. The cooler 3b includes a cooler body 30 made of resin, a pair of metal plates 13a and 13b, and a pair of gaskets 12a and 12b. The metal plates 13 are made of copper, aluminum (Al), or an alloy containing copper and/or aluminum. The cooler body 30 includes a flow channel Ps through which the coolant flows. The cooler body 30 has openings 32a and 32b provided in positions facing the semiconductor devices 5 on both sides. The openings 32a and 32b communicate with the flow channel Ps. It should be noted that FIG. 2 omits to illustrate insulating sheets 46 to be described later.

The cooler body 30 has a tubular portion 35a provided at one end of the cooler body 30 in a Y direction (which is a direction perpendicular to the X direction and a direction connecting the coolant supply pipe 91 with the coolant discharge pipe 92). Provided in the tubular portion 35a is a communicating hole 34a that extends from one end to the other end along the X direction. Further, the cooler body 30 has a tubular portion 35b provided at the other end of the cooler body 30 in the Y direction. Provided in the tubular portion 35b is a communicating hole 34b that extends from one end to the other end along the X direction. The communicating holes 34a and 34b communicate with communicating holes provided in tubular portions of adjacent coolers 3 (i.e., the coolers 3a and 3c shown in FIG. 1). The coolers 3a to 3e are identical in structure to each other. Therefore, all of the coolers 3 communicate with each other so that the coolant introduced from the coolant supply pipe 91 runs through all of the coolers 3.

The metal plate 13a is fixed to the semiconductor device 5a. Similarly, the metal plate 13b is fixed to the semiconductor device 5b. Although not illustrated in FIG. 2, the metal plate 13b configuring the cooler 3a is fixed to a side of the semiconductor device 5a opposite to the metal plate 13a of the cooler 3b (see also FIG. 1). The metal plate 13a configuring the cooler 3c is fixed to a side of the semiconductor device 5b opposite to the metal plate 13b of the cooler 3b. A relationship between the semiconductor devices 5 and the metal plates 13 will be described later.

The cooler opening 32a is closed by the metal plate 13a with the gasket 12a sandwiched between the cooler opening 32a and the metal plate 13a. The cooler opening 32b is closed by the metal plate 13b with the gasket 12b sandwiched between the cooler opening 32b and the metal plate 13b. A plurality of fins 14a is provided on a surface 15 of the metal plate 13a that faces the flow channel Ps. A plurality of fins 14b is provided on a surface 15 of the metal plate 13b that faces the flow channel Ps. The fins 14 are disposed in the flow of the coolant. The provision of the fins 14 increases an area of contact between the metal plates 13 and the coolant. Heat generated by the semiconductor devices 5 is absorbed into the coolant via the metal plates 13.

The semiconductor module 10 is described with reference to FIG. 3. FIG. 3 is a cross-sectional view of the semiconductor device 5b and its surrounding components. The semiconductor module 10 comprises the semiconductor device 5b, insulating sheets 46a and 46b, and the metal plates 13a and 13b (see also FIG. 2). That is, the semiconductor module 10 comprises a semiconductor device 5, the insulating sheets 46, and some of the components configuring the coolers 3 (i.e., the metal plates 13). The metal plate 13a, the insulating sheet 46a, the semiconductor device 5b, the insulating sheet 46b, and the metal plate 13b are stacked on each other in this order.

The semiconductor device 5b includes a semiconductor element 56a and a semiconductor element 56b. The semiconductor element 56a is disposed between a heat transfer plate 40a and a heat transfer plate 52a. The semiconductor element 56b is disposed between a heat transfer plate 40b and a heat transfer plate 52b. Each of the semiconductor elements 56a and 56b include an IGBT and a feedback diode connected in parallel to the IGBT. Although not illustrated, an emitter of the IGBT and an anode of the feedback diode are connected to a common electrode, and a collector of the IGBT and a cathode of the feedback diode are connected to a common electrode.

An anode electrode (emitter electrode) of the semiconductor element 56a is joined to the heat transfer plate 52a via a jointing member 54a made of metal. A cathode electrode (collector electrode) of the semiconductor element 56a is joined to a spacer 44a made of metal via a jointing member 58a made of metal. The spacer 44a is joined to the heat transfer plate 40a via a jointing member 42a made of metal. An anode electrode (emitter electrode) of the semiconductor element 56b is joined to the heat transfer plate 52b via a jointing member 54b made of metal. A cathode electrode (collector electrode) of the semiconductor element 56b is joined to a spacer 44b made of metal via a jointing member 58b made of metal. The spacer 44b is joined to the heat transfer plate 40b via a jointing member 42b made of metal. The heat transfer plate 40a is joined to a lead 45 made of metal via a jointing member 60a made of metal. Further, the heat transfer plate 52b is joined to the lead 45 made of metal via a jointing member 60b. That is, the heat transfer plate 40a and the heat transfer plate 52b are electrically connected to each other. The semiconductor element 56a and the semiconductor element 56b are connected in series. The jointing members 42, 54, 58, and 60 are made of solder. The heat transfer plates 40 and 52 and the spacers 44 are made of copper (Cu).

The semiconductor elements 56a and 56b are sealed with a first molding 48 made of resin. One surface of the first molding 48 is joined to the metal plate 13a (i.e., a part of the cooler 3) via the insulating sheet 46a. Another surface of the first molding 48 is joined to the metal plate 13b via the insulating sheet 46b. That is, both surfaces of the first molding 48 are joined to the metal plates 13 via the insulating sheets 46, respectively. This allows both surfaces of each semiconductor device 5 to be cooled by the coolers 3, respectively. The heat transfer plates 40a, 40b, 52a, and 52b are almost entirely covered with the first molding 48, excluding their surfaces. The heat transfer plates 40a, 40b, 52a, and 52b are partially covered with the first molding 48, and the surfaces of the heat transfer plates 40a, 40b, 52a, and 52b that face the respective metal plates 13 (i.e., are in contact with the insulating sheets 46) are exposed from the first molding 48. That is, the heat transfer plates 40a, 40b, 52a, and 52b are each exposed on a part of corresponding contact surfaces 48a at which each semiconductor device 5 is in contact with the corresponding insulating sheets 46. The first molding 48 is an example of the resin molding. The metal plates 13 are made of copper, aluminum (Al), or an alloy containing copper and/or aluminum as a constituent element.

A side surface 48b of the first molding 48 (i.e., a surface of the first molding 48 directed in the Y direction) extends away from each insulating sheet 46. The side surface 48b becomes larger in size in the Y direction toward a center in the X direction. More specifically, a size of the first molding 48 in the Y direction is smallest at both ends in the X direction and largest at a middle point in the X direction. The side surface 48b is tapered with respect to the contact surfaces 48a. That is, the size of the first molding 48 in the Y direction increases at a constant rate from an outer edge of each contact surface 48a toward the middle point in the X direction. Areas of both ends (contact surfaces 48a) of the first molding 48 in the X direction are equal to each other. The first molding 48 is made of epoxy resin or PPS (polyphenylene sulfide) resin.

The insulating sheets 46 (insulating sheets 46a and 46b) are made of resin. Each insulating sheet 46 is disposed between the corresponding heat transfer plates 40 and the corresponding metal plate 13 (i.e., a part of the cooler 3). The insulating sheet 46 insulates the heat transfer plates 40 and the metal plate 13 from each other. Further, the insulating sheet 46 joins the metal plate 13 to the first molding 48 and the heat transfer plates 40. A size of the insulating sheet 46 is larger than a size of the contact surface 48a of the first molding 48. That is, an area of a side of each insulating sheet 46 that is in contact with the first molding 48 is larger than an area of a surface (contact surface 48a) of the first molding 48. Further, an area of a side of the insulating sheet 46 that is in contact with the metal plate 13 is smaller than an area of a surface (a side of a surface that is in contact with the insulating sheet 46) of the metal plate 13. The insulating sheets 46 are made of epoxy resin, polyimide resin, or the like.

Each insulating sheet 46 insulates the corresponding metal plate 13 and the corresponding heat transfer plates 40 from each other and joins the corresponding metal plate 13 and the corresponding semiconductor device 5 to each other. The metal plates 13 and the semiconductor device 5 can be joined to each other by disposing an insulating sheet 46 between each of the metal plates 13 and the semiconductor device 5 and applying a load between each of the metal plates 13 and the semiconductor device 5. More specifically, the metal plates 13 and the semiconductor device 5 can be joined to each other by applying a compressive force between the cooler 3a and the cooler 3e (more accurately, between the cover 4a and the cover 4b) with the semiconductor devices 5 (semiconductor devices 5a to 5d) and the coolers 3 (coolers 3a to 3e) alternately stacked on each other (see also FIG. 1). As noted above, each metal plate 13 is a part of a cooler 3. Therefore, it can be said that each semiconductor device 5 is fixed to a cooler 3. It should be noted that since the areas of both ends of the first molding 48 in the X direction are equal to each other, the area of the contact surface 48a between the first molding 48 and the insulating sheet 46a and the area of the contact surface 48a between the first molding 48 and the insulating sheet 46b are equal to each other.

Figure 3:
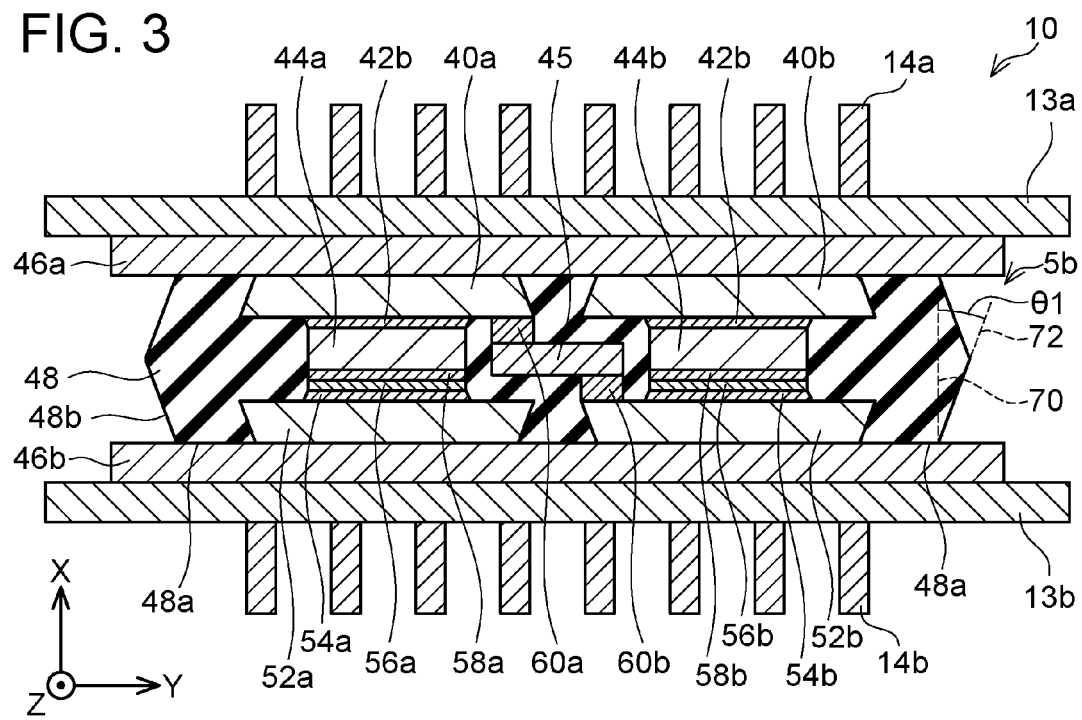
FIG. 3 is a cross-sectional view taken along line III-III in FIG. 1.

A virtual line 70 shown in FIG. 3 indicates a segment that extends along a perpendicular direction to the contact surfaces 48a between the first molding 48 and the insulating sheets 46. Further, a virtual line 72 indicates a segment that extends along the side surface 48b of the first molding 48. In the semiconductor module 10, the side surface 48b of the first molding 48 is inclined away from a center of the first molding 48 relative to the perpendicular direction (i.e. the direction along which the virtual line 70 extends) to the contact surfaces 48a. In other words, as a distance from the side surface 48b of the first molding 48 to each contact surface 48a increases, a distance from a line to the side surface 48b increases, the line passing through the center of the first molding 48 and being perpendicular to the contact surface 48a. Further, the first molding 48 is formed so that an angle of inclination θ1 of the side surface 48b is 3 degrees or larger and 17 degrees or smaller. The term "angle" or "angle of inclination" as used herein refers to an acute angle.

Advantages of the semiconductor module 10 will be described. As noted above, in the semiconductor module 10, the angle of inclination θ1 is adjusted to be 3 degrees or larger and 17 degrees or smaller. In a case where the semiconductor elements 56 are sealed with the first molding 48, the semiconductor elements 56 are sealed by injecting resin into a mold that is divided in the X direction so that surfaces facing the metal plates 13 are flattened. In this case, for example when the angle of inclination θ1 is smaller than 3 degrees, it becomes difficult to release the semiconductor device 5 (i.e., the first molding 48 whose resin has cured) from the mold. Setting the angle of inclination θ1 at 3 degrees or larger allows the semiconductor device 5 to have good mold release characteristics from the mold. Further, setting the angle of inclination θ1 at 17 degrees or smaller makes it possible to suppress damage to the insulating sheets 46. The following will describe, with reference to FIG. 7, a reason why setting the angle of inclination θ1 at 17 degrees or smaller makes it possible to suppress damage to the insulating sheets 46.

Figure 7:
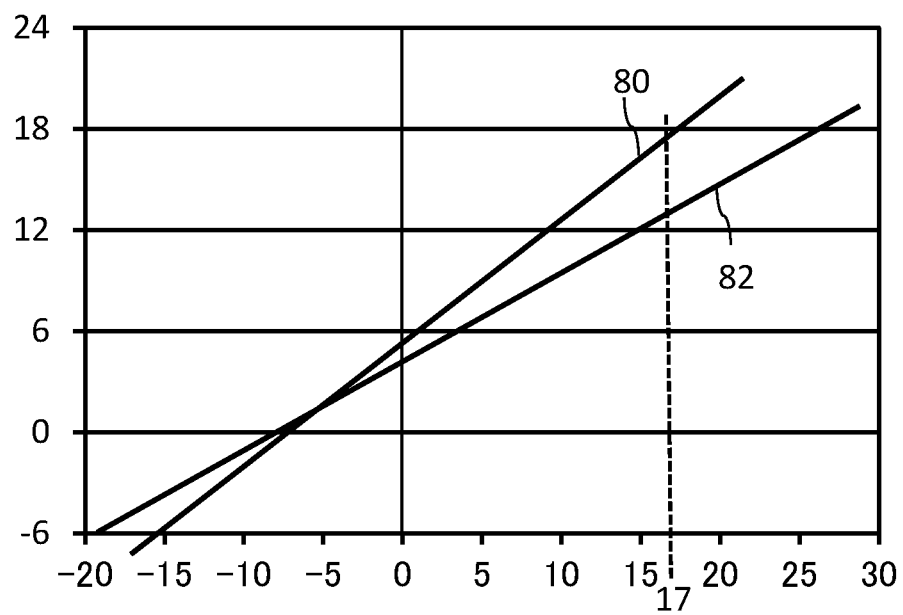
FIG. 7 show a relationship between an angle that is formed by a resin molding and an insulating sheet and forces that are applied from the resin molding to the insulating sheet.

FIG. 7 shows a relationship between the angle of inclination θ1 and stresses that are applied from the first molding 48 to an insulating sheet 46, when the first molding 48 thermally expands in a case where a polyimide resin sheet is used as the insulating sheet 46. A horizontal axis represents the angle of inclination θ1 (degrees), and a vertical axis represents the stresses (MPa) that are applied to the insulating sheet 46. A straight line 80 represents a vertical tensile stress that is applied to the insulating sheet 46, and a straight line 82 represents a shearing stress that is applied to the insulating sheet 46.

As shown in FIG. 7, in a case where the angle of inclination θ1 is 17 degrees or smaller, the stresses (i.e. the vertical tensile stress and the shearing stress) that are applied to the insulating sheet 46 are lower than 18 MPa. As noted above, each insulating sheet 46 insulates the first molding 48 from the corresponding metal plate 13 and joins the first molding 48 to that metal plate 13. Examples of an insulating sheet having such properties include a polyimide resin sheet and an epoxy resin sheet. Such polyimide resin sheet has a strength (tensile strength, shearing strength) of 18 MPa, and such epoxy resin sheet has a strength of 20 MPa. Therefore, for example in a case where the insulating sheet 46 used is the polyimide resin sheet, application of a force greater than 18 MPa to the insulating sheet 46 may cause damage to the insulating sheet 46. As is evident from FIG. 7, when the angle of inclination θ1 is 17 degrees or smaller, the force that is applied to the insulating sheet 46 can be made smaller than the force that causes damage to the insulating sheet 46 (i.e., the strength of the polyimide resin sheet). It should be noted that even in a case where the insulating sheet 46 used is the epoxy resin sheet, the force that is applied to the insulating sheet 46 can be made smaller than the force (20 MPa) that causes damage to the insulating sheet 46, provided that the angle of inclination θ1 is 17 degrees or smaller. Adjusting the angle of inclination θ1 to be 17 degrees or smaller makes it possible to prevent the insulating sheet 46 from being damaged.

As shown in FIG. 3, parts of the coolers 3 (i.e., the metal plates 13 and the fins 14) are attached to the semiconductor module 10 in advance. Therefore, assembling of the coolers 3 unambiguously determines positions of the semiconductor devices 5 with respect to the coolers 3. This makes it unnecessary to position the semiconductor devices 5 in relation to the coolers 3. As noted above, the semiconductor devices 5 and the coolers 3 are joined to each other by applying a compressive force between the coolers 3 (i.e., the cooler 3a and the cooler 3e) located at both ends in the stacking direction. The step of applying compressive force between the coolers located at both ends in the stacking direction has also been performed in a configuration (conventional art) in which an insulating sheet is disposed inside a resin molding. The semiconductor module 10 disclosed in the present embodiment makes it possible, without increasing the number of steps as compared with the conventional art, to dispose the insulating sheets 46 outside each resin molding 48 and fix the coolers 3 to both surfaces of each semiconductor device 5 by utilizing the curing of the insulating sheets 46. This makes it possible to eliminate use of a jointing material (such as grease) between each semiconductor device 5 and the corresponding cooler 3 only to join each semiconductor device 5 and the corresponding cooler 3 to each other. Further, since the insulating sheets 46 are disposed outside the resin molding 48, a thermal conductivity of the insulating sheets 46 per se can be enhanced, for example, by selecting a highly thermally-conductive material as a material of which the insulating sheets 46 are made or by reducing a thickness of each insulating sheet 46.

Second Embodiment

A semiconductor module 210 will be described with reference to FIG. 4. The semiconductor module 210 is a modification of the semiconductor module 10. Components of the semiconductor module 210 which are identical to those of the semiconductor module 10 are given the same reference numerals or reference numerals having two digits of which are identical to those of the semiconductor module 10, and as such, may not be described below. The semiconductor module 210 differs from the semiconductor module 10 with respect to a structure surrounding each semiconductor device 5 (5b). It should be noted that, as with the semiconductor module 10, the semiconductor module 210 can be used as a component of a power converter (see also FIG. 1).

The semiconductor module 210 includes a first molding 48 and second moldings 78. The first molding 48 and a structure inside the first molding 48 are the same as those of the semiconductor module 10. Each second molding 78 is in contact with both of a side surface 48b of the first molding 48 and an insulating sheet 46. More specifically, each second molding 78 covers a surface of the insulating sheet 46 and a part of the side surface 48b of the first molding 48. Further, the second molding 78 includes a non-contact surface 78b that is in contact with neither the insulating sheet 46 nor the first molding 48. Each second molding 78 extends around a range of contact (i.e., a contact surface 48a) between the semiconductor device 5 and the insulating sheet 46. The second molding 78 is an example of the resin member.

In the semiconductor module 210, each second molding 78 surrounds and covers a part of the first molding 48 at a position where the first molding 48 is in contact with the corresponding insulating sheet 46. Each second molding 78 is formed by joining the first molding 48 to a metal plate 13 via an insulating sheet 46 and then applying potting resin to a contact portion between the first molding 48 and that insulating sheet 46. That is, the second moldings 78 are formed after semiconductor elements 56 are sealed with the first molding 48 and the semiconductor elements 56 thus sealed (i.e., the first molding 48) are taken out of a mold. It should be noted that the second moldings 78 (potting resin) are made of epoxy resin, polyimide resin, or the like.

As noted above, the first molding 48 is covered with the second moldings 78 at the positions where the first molding 48 is in contact with the insulating sheets 46. Therefore, when the first molding 48 and the second moldings 78 thermally expand, a force of thermal expansion of the first molding 48 and the second moldings 78 concentrates on outer edges of contact surfaces 78a between each second molding 78 and the corresponding insulating sheet 46.

Figure 4:
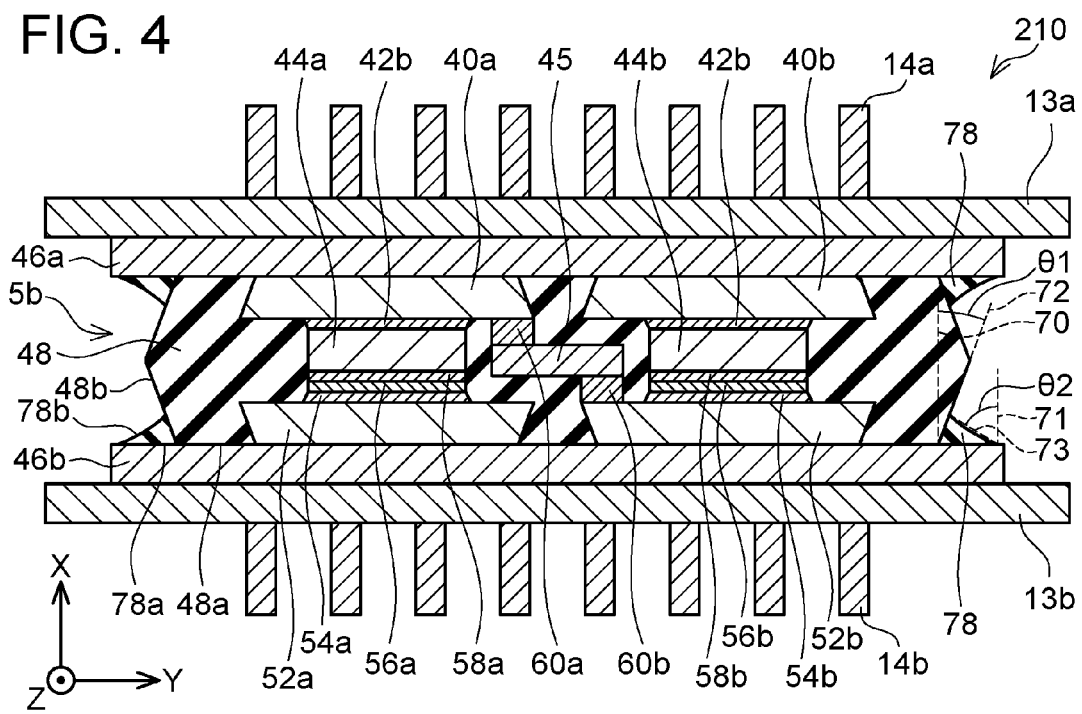
FIG. 4 is a cross-sectional view of a semiconductor module according to a second embodiment.

A virtual line 71 shown in FIG. 4 indicates a segment that extends along a perpendicular direction to the contact surfaces 78a between each second molding 78 and the corresponding insulating sheet 46. Further, a virtual line 73 indicates a segment that extends along the non-contact surface 78b of each second molding 78. Assuming here that when an angle of inclination of the non-contact surface 78b is positive in a case where the non-contact surface 78b is inclined away from the center of the first molding 48 relative to the perpendicular direction and the angle of inclination of the non-contact surface 78b is negative in a case where the non-contact surface 78b is inclined toward the center of the first molding 48 relative to the perpendicular direction, the angle of inclination θ2 of the non-contact surface 78b takes a negative value. As noted above, in the semiconductor module 10, when the angle of inclination θ1 is 17 degrees or smaller, the force that is applied from the first molding 48 to the corresponding insulating sheet 46 can be made smaller than the force that causes damage to that insulating sheet 46 (see also FIG. 7). This phenomenon also applies to a relation between the second moldings 78 and the insulating sheets 46. That is, when the angle of inclination θ2 is 17 degrees or smaller, the force that is applied from each second molding 78 to the corresponding insulating sheet 46 can be made smaller than the force that causes damage to that insulating sheet 46.

As is evident from FIG. 7, there is a proportional relation between an angle of inclination θ (θ1, θ2) and a force that is applied to an insulating sheet. This phenomenon also applies even when the angle of inclination θ takes a negative value. In particular, when the angle of inclination θ2 is −15 degrees or smaller, compressive forces are applied from the moldings (i.e., the first molding 48 and the second moldings 78) to the insulating sheets 46, thus making it difficult for the moldings and the insulating sheets 46 to peel from each other. As noted above, in the semiconductor module 210, the angle of inclination θ2 is adjusted to be 3 degrees or larger. This allows, as with the semiconductor module 10, the first molding 48 to have good mold release characteristics from a mold. Further, in the semiconductor module 210, the force of thermal expansion of the first molding 48 and the second moldings 78 concentrates on the outer edges of the second moldings 78. Therefore, even when the angle of inclination θ1 is 17 degrees or larger, the insulating sheets 46 can be prevented from being damaged. In other words, the use of the second moldings 78 makes it possible to set the angle of inclination θ1 of the first molding 48 at 17 degrees or larger. This allows the first molding 48 to have good mold release characteristics from a mold.

Third Embodiment

A semiconductor module 310 will be described with reference to FIG. 5. The semiconductor module 310 is a modification of the semiconductor module 210, and differs from the semiconductor module 210 with respect to a structure surrounding each semiconductor device 5 (5b). Components of the semiconductor module 310 which are identical to those of the semiconductor module 210 are given the same reference numerals or reference numerals having two digits that are identical to those of the semiconductor module 210, and as such, may not be described below.

Figure 5:
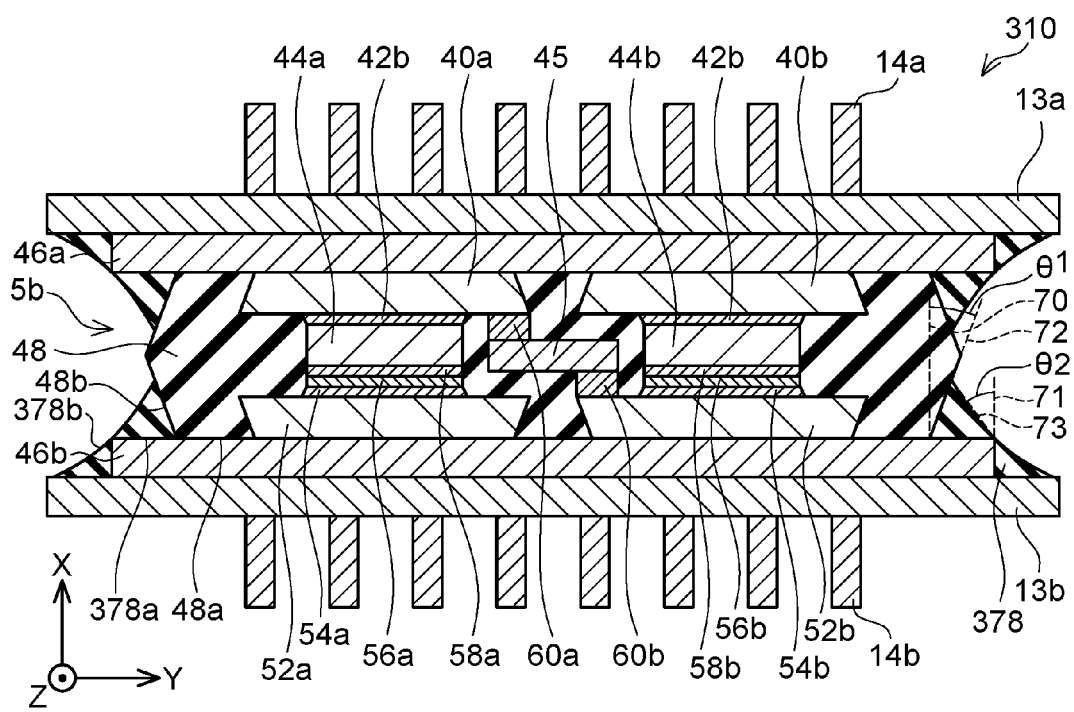
FIG. 5 is a cross-sectional view of a semiconductor module according to a third embodiment.
Figure 6:
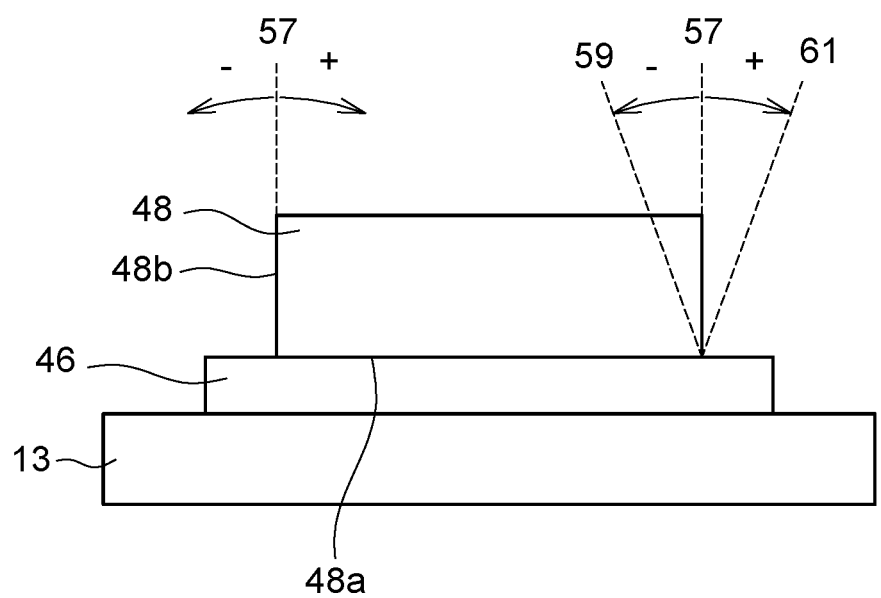
FIG. 6 illustrates a structure in which a resin molding, an insulating sheet, and a cooler are stacked on each other.

As shown in FIG. 5, each of second moldings 378 covers a whole surface of a corresponding insulating sheet 46 and also covers a part of a surface of a corresponding metal plate 13. In other words, each insulating sheet 46 is sealed with the corresponding second molding 378. Therefore, an end of each second molding 378 is not located on the surface of the insulating sheet 46. Therefore, even when a first molding 48 and the second moldings 378 thermally expand, the force generated by the thermal expansion does not concentrate on the surfaces of the insulating sheets 46. This makes it possible to more surely suppress damage to the insulating sheets 46. Further, each second molding 378 is in contact with both of the first molding 48 and the corresponding metal plate 13, thus making it possible to further enhance a joint strength between the first molding 48 and that metal plate 13.

As noted above, the second moldings 378 (potting resin) are made of epoxy resin, polyimide resin, or the like. The second moldings 378 are made of a material whose linear expansion coefficient is greater than a linear expansion coefficient of the first molding 48 and smaller than a linear expansion coefficient of the metal plates 13. For example, in a case where the first molding 48 is made of epoxy resin and the metal plates 13 are made of aluminum, the second moldings 378 are made of polyimide resin, whose linear expansion coefficient lies between a linear expansion coefficient (14 ppm/K) of epoxy resin and a linear expansion coefficient (23 ppm/K) of aluminum. It should be noted that the second molding 378 can be formed by using a larger amount of potting resin than in the semiconductor module 210.

Each of the embodiments described above has been explained with respect to the configuration in which the coolers 3 (metal plates 13) are fixed to both surfaces of each semiconductor device 5. However, the technology disclosed herein can also be applied to a configuration in which one cooler 3 is fixed to one surface of each semiconductor device 5 via an insulating sheet 46. What is important here is that, in the case of the semiconductor module 10, the first molding 48 is formed such that the side surface 48b of the first molding 48 is inclined away from a center of the first molding 48 relative to the perpendicular direction to the contact surfaces 48a between each first molding 48 and the corresponding insulating sheet 46, and such that the angle of inclination θ1 of the side surface 48b relative to the perpendicular direction is 3 degrees or larger and 17 degrees or smaller. Further, in the case of the semiconductor module 210 or 310, it is important that the angle of inclination θ1 of the side surface 48b of the first molding 48 is 3 degrees or larger, and that the angle of inclination θ2 of the surface 78b (378b) of the second molding 78 relative to the perpendicular direction to the contact surfaces 78a (378a) between each second molding 78 (378) and the corresponding insulating sheet 46 is 17 degrees or smaller.

The following will describe some of the technical features of a semiconductor module disclosed herein. It should be noted that the features described below each independently have technical utility.

A semiconductor module may comprise a semiconductor device, an insulating sheet, and a cooler, and the semiconductor device, the insulating sheet, and the cooler are stacked on each other. The semiconductor device may comprise a semiconductor element, a heat transfer plate that is connected to the semiconductor element, and a resin molding that seals the semiconductor element and the heat transfer plate. The resin molding may include a contact surface that is in contact with the insulating sheet and a side surface that extends away from the insulating sheet. The heat transfer plate may be exposed on a part of the contact surface between the resin molding and the insulating sheet. The heat transfer plate may be electrically connected to an electrode of the semiconductor element. It should be noted that the heat transfer plate may be directly connected to the electrode of the semiconductor element, or may be indirectly connected to the electrode of the semiconductor element via another component. The semiconductor device may be fixed to a part of a component configuring a cooler, not to the cooler as a finished product. An area of the insulating sheet may be larger than an area of a contact surface of the semiconductor device that is in contact with the insulating sheet. Further, an area of the cooler may be larger than a contact surface of the insulating sheet that is in contact with the cooler.

The side surface of the resin molding (i.e., a side surface of the semiconductor device) may be tapered. The side surface of the resin molding may be inclined away from a center of the resin molding relative to a perpendicular direction to the contact surface between the resin molding and the insulating sheet. An angle of inclination of the side surface of the resin molding relative to the perpendicular direction may be 3 degrees or larger and 17 degrees or smaller. In other words, an angle between the surface of the resin molding that is in contact with the insulating sheet and the side surface of the resin molding may be 93 degrees or larger and 107 degrees or smaller.

The semiconductor module may include a resin member that is in contact with both of the side surface of the resin molding and the surface of the insulating sheet. The resin member may extend around the side surface of the resin molding. Alternatively, the resin member may be provided on a part of the side surface of the resin molding. The resin member may include a contact surface that is in contact with the insulating sheet and a non-contact surface that is in contact with neither the insulating sheet nor the resin molding. The resin member may be in contact with the cooler. In this case, the resin member may cover the insulating sheet outside the contact surface between the resin molding and the insulating sheet. A linear expansion coefficient of the resin member may be greater than a linear expansion coefficient of the resin molding, and may be smaller than a linear expansion coefficient of the cooler.

In a semiconductor module including a resin member, assuming that a contact surface between a resin molding and an insulating sheet is a first contact surface and a contact surface between the resin member and the insulating sheet is a second contact surface, a side surface of the resin molding may be inclined away from a center of the resin molding relative to a perpendicular direction to the first contact surface, and an angle of inclination of the side surface of the resin molding relative to the perpendicular direction may be 3 degrees or larger. Further, when an angle of inclination of a surface of the resin member is positive in a case where the surface is inclined away from the center of the resin molding relative to a perpendicular direction to the second contact surface (i.e., when the angle of inclination of the surface of the resin member is negative in a case where the surface is inclined toward the center of the resin molding relative to the perpendicular direction to the second contact surface), the angle of inclination of the surface of the resin member relative to the perpendicular direction may be 17 degrees or smaller. In other words, an angle between a surface of the resin molding that is in contact with the insulating sheet and the side surface of the resin molding may be 93 degrees or larger, and an angle between a surface of the resin member that is in contact with the insulating sheet and a surface of the resin member that is in contact with neither the insulating sheet nor the resin molding may be 107 degrees or smaller.

Specific examples of the present invention are described above in detail, but these examples are merely illustrative and place no limitation on the scope of the patent claims. The technology described in the patent claims also encompasses various changes and modifications to the specific examples described above. The technical elements explained in the present specification or drawings provide technical utility either independently or through various combinations. The present invention is not limited to the combinations described at the time the claims are filed. Further, the purpose of the examples shown by the present specification or drawings is to satisfy multiple objectives simultaneously, and satisfying any one of those objectives gives technical utility to the present invention.

What is claimed is:

1. A semiconductor module comprising a semiconductor device; an insulating sheet; and a cooler, wherein
   the semiconductor device, the insulating sheet, and the cooler are stacked on each other,
   the semiconductor device comprises a semiconductor element, a heat transfer plate connected to the semiconductor element, and a resin molding sealing the semiconductor element and the heat transfer plate,
   the resin molding comprises a contact surface that is in contact with the insulating sheet and a side surface that extends away from the insulating sheet,
   the heat transfer plate is exposed on a part of the contact surface,
   the side surface of the resin molding is inclined away from a center of the resin molding relative to a perpendicular direction to the contact surface, and an angle of inclination of the side surface relative to the perpendicular direction is 3 degrees or larger and 17 degrees or smaller.

2. The semiconductor module according to claim 1, wherein
a distance from the side surface to a center line increases as a distance from the side surface to the contact surface increases, wherein the center line passes through the center of the of the resin molding and extends along the perpendicular direction.

3. The semiconductor module according to claim 2, wherein the insulating sheet is disposed between the semiconductor device and the cooler.

4. A semiconductor module comprising: a semiconductor device; an insulating sheet; a cooler; and a resin member, wherein
the semiconductor device, the insulating sheet, and the cooler are stacked on each other,
the semiconductor device comprises a semiconductor element, a heat transfer plate that is connected to the semiconductor element, and a resin molding that seals the semiconductor element and the heat transfer plate,
the resin molding comprises a first contact surface in contact with the insulating sheet and a side surface that extends away from the insulating sheet,
the heat transfer plate is exposed on a part of the first contact surface,
the side surface of the resin molding is inclined away from a center of the resin molding relative to a perpendicular direction to the first contact surface,
a first angle of inclination of the side surface relative to the perpendicular direction is 3 degrees or larger,
the resin member is in contact with both of the side surface and the insulating sheet,
the resin member comprises a second contact surface that is in contact with the insulating sheet and a non-contact surface that is in contact with neither the insulating sheet nor the resin molding,
when a second angle of inclination of the non-contact surface is positive in a case where the non-contact surface is inclined away from the center of the resin molding relative to a perpendicular direction to the second contact surface, the second angle of inclination relative to the perpendicular direction is 17 degrees or smaller.

5. The semiconductor module according to claim 4, wherein
the insulating sheet is larger than the first contact surface,
the cooler is larger than the insulating sheet, and
the resin member is in contact with the resin molding, the insulating sheet, and the cooler.

6. The semiconductor module according to claim 5, wherein
a linear expansion coefficient of the resin member is greater than a linear expansion coefficient of the resin molding, and is smaller than a linear expansion coefficient of the cooler.

* * * * *